United States Patent
Lan et al.

(10) Patent No.: US 8,901,565 B2
(45) Date of Patent: Dec. 2, 2014

(54) THIN FILM TRANSISTOR COMPRISING PIXEL ELECTRODE

(71) Applicant: E Ink Holdings Inc., Hsinchu (TW)

(72) Inventors: Wei-Chou Lan, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/025,836

(22) Filed: Sep. 13, 2013

(65) Prior Publication Data

US 2014/0151720 A1 Jun. 5, 2014

(30) Foreign Application Priority Data

Dec. 5, 2012 (TW) .............................. 101145713 A

(51) Int. Cl.
| | | |
|---|---|---|
| *H01L 29/04* | (2006.01) | |
| *H01L 29/10* | (2006.01) | |
| *H01L 27/12* | (2006.01) | |
| *H01L 27/32* | (2006.01) | |
| *H01L 33/00* | (2010.01) | |
| *H01L 29/49* | (2006.01) | |

(52) U.S. Cl.
CPC ........ *H01L 33/0041* (2013.01); *H01L 27/3262* (2013.01); *H01L 27/3244* (2013.01); *H01L 27/1203* (2013.01); *H01L 27/1214* (2013.01); *H01L 29/4908* (2013.01)
USPC ................. 257/59; 257/72; 257/329; 257/350

(58) Field of Classification Search
CPC ............ H01L 27/1214; H01L 29/4908; H01L 27/1203; H01L 27/3244; H01L 27/3262
USPC ...................... 257/59, 72, 329, 350
See application file for complete search history.

(56) References Cited

U.S. PATENT DOCUMENTS

| | | | |
|---|---|---|---|
| 4,859,623 A | | 8/1989 | Busta |
| 4,949,141 A | | 8/1990 | Busta |
| 5,001,540 A | * | 3/1991 | Ishihara ........................ 257/329 |
| 5,668,391 A | | 9/1997 | Kim et al. |
| 5,780,327 A | | 7/1998 | Chu et al. |
| 6,049,106 A | * | 4/2000 | Forbes ......................... 257/329 |
| 6,107,660 A | * | 8/2000 | Yang et al. .................... 257/329 |
| 6,165,823 A | | 12/2000 | Kim et al. |
| 6,747,313 B1 | * | 6/2004 | Gil ................................ 257/329 |
| 7,629,633 B2 | | 12/2009 | Chan et al. |
| 7,723,781 B2 | * | 5/2010 | Joshi et al. .................... 257/329 |
| 8,203,662 B2 | | 6/2012 | Kang et al. |
| 2005/0258427 A1 | | 11/2005 | Chan et al. |
| 2008/0217619 A1 | * | 9/2008 | Shimada ........................ 257/59 |
| 2009/0014783 A1 | * | 1/2009 | Forbes .......................... 257/329 |
| 2013/0092942 A1 | * | 4/2013 | Park et al. ...................... 257/57 |

* cited by examiner

*Primary Examiner* — Ngan Ngo
(74) *Attorney, Agent, or Firm* — Jianq Chyun IP Office

(57) ABSTRACT

A semiconductor device adapted for being disposed on a substrate is provided. The semiconductor device includes a pixel electrode, a drain, a semiconductor channel layer, a source, a gate insulation layer and a side-gate. The pixel electrode is disposed on the substrate. The drain is disposed on the pixel electrode and exposes a portion of pixel electrode. The semiconductor channel layer is disposed on the drain. The source is disposed on the semiconductor channel layer. The gate insulation layer is disposed on the substrate, at least covers the source and surrounds the semiconductor channel layer. The side-gate is disposed on the gate insulation layer and extendedly covers the substrate along at least one side of the gate insulation layer. An extending direction of a portion of the side-gate is identical to a stacking direction of the drain, the semiconductor channel layer and the source.

6 Claims, 6 Drawing Sheets

THIN FILM TRANSISTOR COMPRISING PIXEL ELECTRODE

CROSS-REFERENCE TO RELATED APPLICATION

This application claims the priority benefit of Taiwan application serial no. 101145713, filed on Dec. 5, 2012. The entirety of the above-mentioned patent application is hereby incorporated by reference herein and made a part of this specification.

BACKGROUND OF THE INVENTION

1. Field of the Invention

The invention relates to a semiconductor device and a manufacturing method thereof. More particularly, the invention relates to a semiconductor device having a side-gate and a manufacturing method thereof.

2. Description of Related Art

Generally, a display is mainly constructed by a thin film transistor (TFT) array substrate, a color filter array substrate and a display medium layer located between said two substrates. In which, the TFT array substrate includes a plurality of pixel units arranged in matrix, each pixel unit includes a TFT and a pixel electrode electrically connected to the TFT. The TFTs are used as switch devices of a display unit. A drain current of the TFT is mainly decided based on a ratio of a width and a length of a channel. Currently, a photolithography process is generally used in manufacturing a top gate TFT structure or a bottom gate TFT structure.

During the photolithography process, the TFT structure is strongly restricted by lithography resolution (i.e., restricted by a wavelength of light source of the device), such that the devices therein cannot be effectively miniaturized. Accordingly, a channel length of a semiconductor channel layer of the TFT cannot be effectively reduced, so that the driving current cannot be effectively increased. Moreover, with the growing demands for improved resolution, reduced response time and increased aperture ratio of the display, the TFT structures are gradually developed toward a trend in reducing size. However, a miniaturized TFT structure is disadvantageous in manufacturing the semiconductor channel layer since it is disadvantageous in reducing the channel length. It may further affect the drain current of the TFT directly thereby affecting the display quality of the display. In addition, a gate is a single-plane structure, which may only function as a unilateral switch and with shading effect instead of proving full functionalities to the semiconductor channel player. In case when a dual gate design is adopted, a number of process masks may be increased, so as to further increase manufacturing costs. Therefore, how to reduce the size of TFT structure while increasing device performance has become a primary issue in developing display.

SUMMARY OF THE INVENTION

The present application is directed to a semiconductor device having a better device performance.

The invention provides a manufacturing method of a semiconductor device for manufacturing above-said semiconductor device.

The invention provides a semiconductor device adapted for being disposed on a substrate. The semiconductor device includes a pixel electrode, a drain, a semiconductor channel layer, a source, a gate insulation layer and a side-gate. The pixel electrode is disposed on the substrate. The drain is disposed on the pixel electrode and exposes a portion of pixel electrode. The semiconductor channel layer is disposed on the drain. The source is disposed on the semiconductor channel layer. The gate insulation layer is disposed on the substrate, at least covers the source and surrounds the semiconductor channel layer. The side-gate is disposed on the gate insulation layer and extendedly covers the substrate along at least one side of the gate insulation layer, in which an extending direction of a portion of the side-gate is identical to a stacking direction of the drain, the semiconductor channel layer and the source.

According to an embodiment of the invention, the semiconductor device further includes a sacrifice layer disposed on the drain, in which the sacrifice layer covers on the semiconductor channel layer, and an upper surface of the sacrifice layer is coplanar with an upper surface of the semiconductor channel layer.

According to an embodiment of the invention, the source is further extendedly disposed on the sacrifice layer.

According to an embodiment of the invention, an orthographic projection area of the source on the substrate is overlapped with and smaller than an orthographic projection area of the drain on the substrate.

According to one embodiment of the present invention, the gate insulating layer covers the source and the semiconductor channel layer.

According to one embodiment of the present invention, the semiconductor device further includes a protective layer covering the side-gate, the gate insulation layer, the drain and the portion of the pixel electrode.

The present invention is also directed to a manufacturing method of a semiconductor device, which includes the following steps. A pixel electrode and a first metal layer located above the pixel electrode are formed on the substrate. A sacrifice material layer is formed to cover the substrate and the first metal layer, in which the sacrifice material layer has an opening, and a portion of the first metal layer is exposed by the opening. A semiconductor material layer is formed in the opening and covers the sacrifice material layer, in which the semiconductor material layer covers the potion of the first metal layer exposed by the opening, and a portion of the semiconductor material layer located in the opening is defined as a semiconductor channel layer. A portion of the semiconductor material layer located on the sacrifice material layer is removed to expose an upper surface of the semiconductor channel layer. A source is formed on the upper surface of the semiconductor channel layer. The sacrifice material layer exposed outside of the source is at least removed by using the source as an etching mask. A gate insulation layer is formed on the substrate, and the gate insulation layer at least covers the source and surrounds the semiconductor channel layer. The first metal layer exposed outside of the gate insulation layer is removed to expose a portion of the pixel electrode and define a drain. A side-gate is formed on the gate insulation layer, the side-gate extendedly covers the substrate along at least one side of the gate insulation layer, in which an extending direction of a portion of the side-gate is identical to a stacking direction of the drain, the semiconductor channel layer and the source.

According to an embodiment of the invention, the process of forming the semiconductor material layer includes sol-gel process, chemical vapor deposition (CVD) or physical vapor deposition (PVD).

According to an embodiment of the invention, the opening is filled with the semiconductor material layer, and an upper surface of the sacrifice material layer is coplanar with the upper surface of the semiconductor channel layer.

According to an embodiment of the invention, the source further extendedly covers the sacrifice material layer while forming the source, and a sacrifice layer is formed to cover the semiconductor channel layer after removing the sacrifice material layer exposed outside of the source.

According to an embodiment of the invention, an orthographic projection area of the source on the substrate is overlapped with and smaller than an orthographic projection area of the semiconductor channel layer on the substrate while forming the source, and the portion of semiconductor material layer is removed while removing the sacrifice material layer exposed outside of the source.

According to one embodiment of the present invention, the gate insulating layer covers the source and the semiconductor channel layer.

According to one embodiment of the present invention, a length of the semiconductor channel layer is equal to a thickness of the semiconductor channel layer.

According to an embodiment of the invention, an orthographic projection area of the source on the substrate is overlapped with and smaller than an orthographic projection area of the drain on the substrate.

According to one embodiment of the present invention, the manufacturing method of the semiconductor device further includes forming a protective layer to cover the side-gate, the gate insulation layer, the drain and the portion of the pixel electrode after forming the side-gate on the gate insulation layer.

Based on of above, according to the present embodiment, the drain, the semiconductor channel layer and the source are sequentially and vertically stacked on the substrate, such that a channel length of the semiconductor channel layer is equal to a thickness of the semiconductor channel layer. Compared with the conventional method of forming the semiconductor channel layer adopting the photolithography process which is restricted by lithography resolution, manufacturing method of the semiconductor channel layer according to the present embodiment may be effectively reduced the channel length without being restricted by the process. Furthermore, since the channel length of the semiconductor channel layer in the present embodiment is shorter than that of the semiconductor channel layer in the conventional technique, the operational voltage required for the semiconductor device according to the present embodiment of the invention may also be substantially reduced. In addition, according to the present embodiment of the invention, a flowing direction of the driving current is identical to a vertical stacking direction of the source, the semiconductor channel layer and the drain. Therefore, an electric current in the semiconductor channel layer is not affected by the grain boundaries, thereby increasing a carrier mobility of the semiconductor device of the present embodiment of the invention.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF THE EMBODIMENTS

Figure 1A:
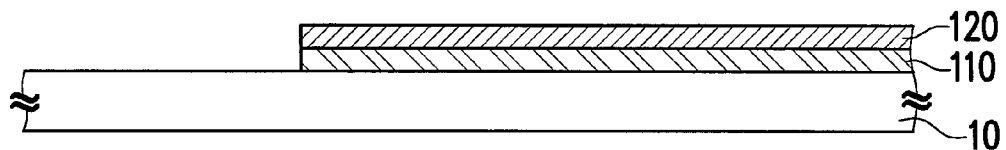
FIG. 1A to FIG. 1G are schematic cross-sectional views illustrating a manufacturing method of a semiconductor device according to an embodiment of the invention.

FIG. 1A to FIG. 1G are schematic cross-sectional views illustrating a manufacturing method of a semiconductor device according to an embodiment of the invention. FIG. 1H is a schematic three-dimensional view of the semiconductor device depicted in FIG. 1G. For the convenience of the description, certain elements are omitted in FIG. 1H. Referring to FIG. 1A, based on the manufacturing method of the semiconductor device according to the present embodiment, first, a pixel electrode 110 and a first metal layer 120 located above the pixel electrode 110 are formed on a substrate 10, in which the pixel electrode 110 exposes a portion of the substrate 10. The substrate 10 may be, for example, a glass substrate or a plastic substrate, the invention is not limited thereto. The pixel electrode 110 may be made of, for example, transparent conductive materials, such as indium tin oxide (ITO), indium zinc oxide (IZO), or metal materials. A material of the first metal layer 120 may be, for example, molybdenum-niobium alloy (MoNb), molybdenum-niobium/aluminum-neodymium alloy (MoNb/AlNd) or molybdenum-niobium/aluminum-neodymium/molybdenum-niobium alloy (MoNb/AlNd/MoNb).

Figure 1B:
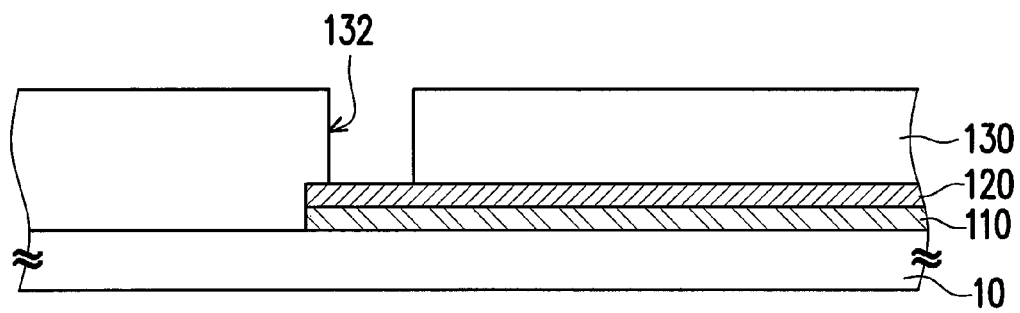

Next, referring to FIG. 1B, a sacrifice material layer 130 is formed to cover the substrate 10 and the first metal layer 120, in which the sacrifice material layer 130 has an opening 132, and the opening 132 exposes a portion of the first metal layer 120. More specifically, the sacrifice material layer 130 covers the portion of the substrate 10 not being covered by the pixel electrode 110, and extendedly covers the first metal layer 120 directly. Herein, a material of the sacrifice material layer 130 includes a photoresist material.

Figure 1C:
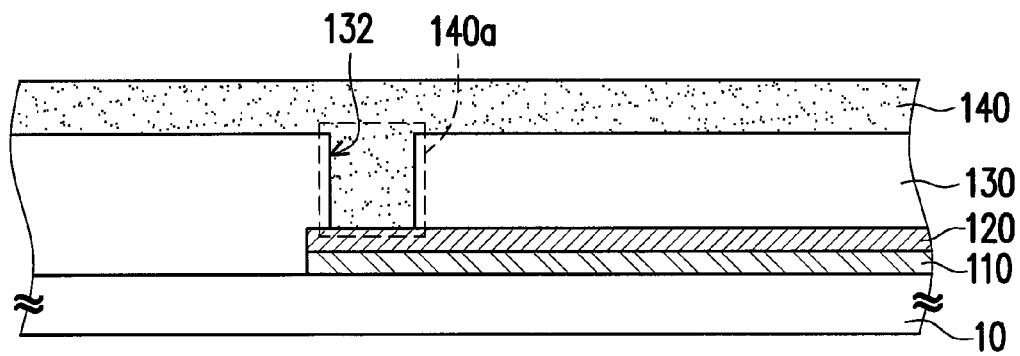

Next, referring to FIG. 1C, a semiconductor material layer 140 is formed in the opening 132 and covers the sacrifice material layer 130, in which the semiconductor material layer 140 covers the potion of the first metal layer 120 exposed by the opening 132, and a portion of the semiconductor material layer 140 located in the opening 132 is defined as a semiconductor channel layer 140a. Herein, a shape of the semiconductor channel layer 140a may be, for example, a rectangle cubic as shown in FIG. 1H. The process of forming the semiconductor material layer 140 may be, for example, sol-gel process, chemical vapor deposition (CVD) or physical vapor deposition (PVD). In which, sol-gel process is used to generate films on the substrate by using spin coating, dip coating, spraying, electrophoresing, ink-jetting, roller coating, etc. Herein, the process of forming the semiconductor material layer 140 is illustrated using sol-gel process, such that the semiconductor material layer 140 may be fully filled in the opening 132 while having a physical thickness on the sacrifice material layer 130. Of course, in other embodiments not being illustrated, the semiconductor material layer may also be formed by using chemical vapor deposition (CVD) or physical vapor deposition (PVD). In that case, the semiconductor material layer formed may be conformally disposed with a surface of a sacrifice layer and the opening, that is, the opening is not filled with the semiconductor material layer, instead, the semiconductor material layer is only being deposited along the inner walls of the opening. In addition, a material of the semiconductor material layer 140 may be, for example, amorphous silicon (a-Si), poly-silicon, organic semiconductor or metal oxide semiconductor.

Figure 1D:
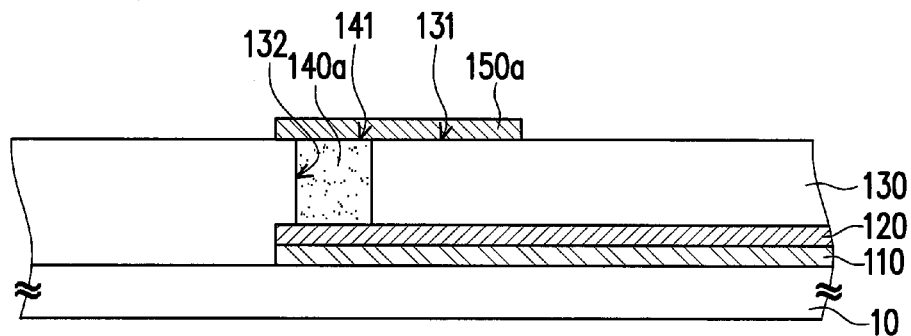

Next, referring to FIG. 1D, a portion of the semiconductor material layer 140 located on the sacrifice material layer 130 is removed to expose an upper surface 141 of the semiconductor channel layer 140a. In this case, an upper surface 131 of the sacrifice material layer 130 is coplanar with the upper surface 141 of the semiconductor channel layer 140a. Herein, a method for removing the potion of the semiconductor material layer 140 on the sacrifice material layer 130 includes lift-off, ashing, dry stripping and wet stripping.

Next, referring back to FIG. 1D, a source 150a is formed on the upper surface 141 of the semiconductor channel layer 140a and the upper surface 131 of the sacrifice material layer 130, in which the source 150a directly covers the upper surface 141 of the semiconductor channel layer 140a and the upper surface 131 of the sacrifice material layer 130. Of course, in other embodiments not being illustrated, the semiconductor material layer may also be formed by using chemical vapor deposition (CVD) or physical vapor deposition (PVD). In that case, the source is only being disposed on the upper surface of the semiconductor channel layer. In addition, a material of the source 150a may be identical to the material the first metal layer 120, which may be, for example, molybdenum-niobium alloy (MoNb), molybdenum-niobium/aluminum-neodymium alloy (MoNb/AlNd) or molybdenum-niobium/aluminum-neodymium/molybdenum-niobium alloy (MoNb/AlNd/MoNb).

Figure 1E:
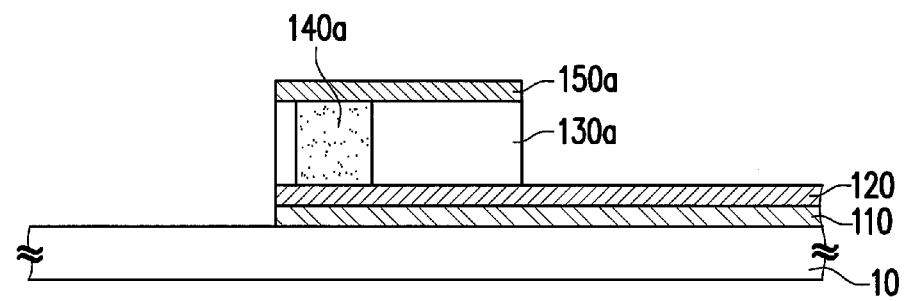

Next, referring to FIG. 1E, a sacrifice layer 130a is formed by removing the sacrifice material layer 130 exposed outside of the source 150a by using the source 150a as an etching mask. Herein, the sacrifice layer 130a covers the semiconductor channel layer 140a, which means that the semiconductor channel layer 140a is surrounded by the sacrifice layer 130a.

Figure 1F:
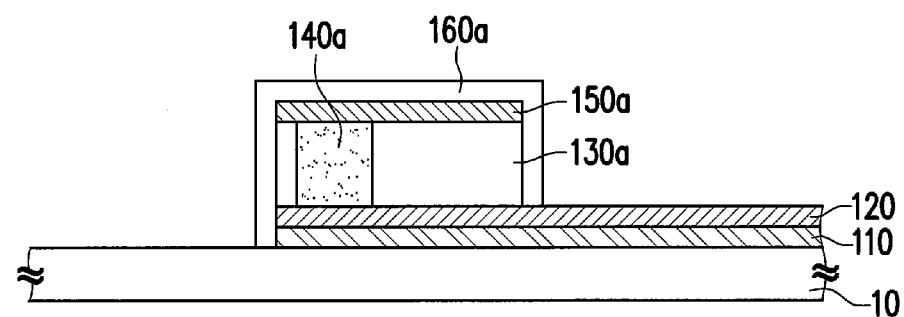

Next, referring to FIG. 1F, a gate insulation layer 160a is formed on the substrate 10, in which the gate insulation layer 160a at least covers the source 150a and surrounds the semiconductor channel layer 140a. Herein, the gate insulation layer 160a covers the source 150a and the sacrifice layer 130a. Furthermore, a material of the gate insulation layer 160a may be, for example, silicon oxide (SiO₂), silicon nitride (SiNx) or polymer.

Figure 1G:
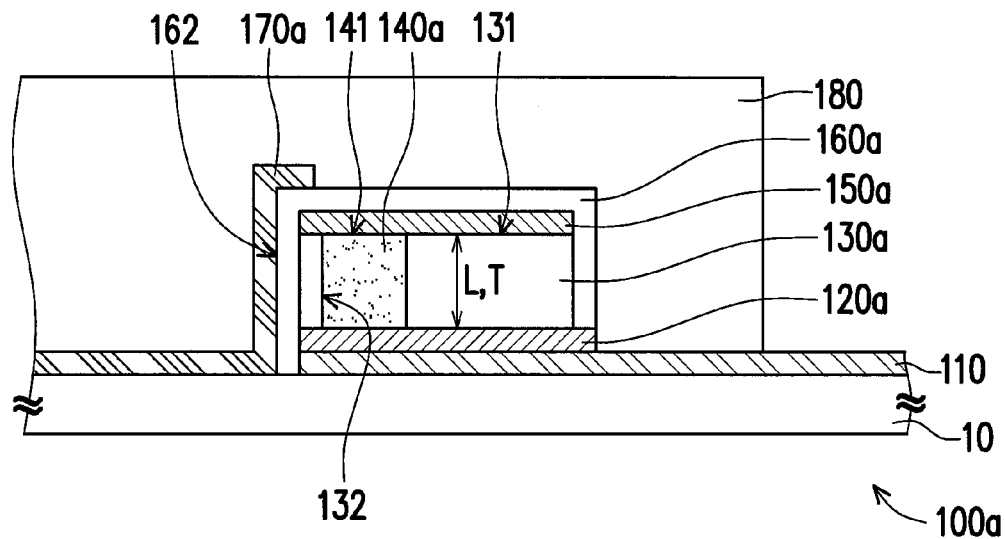
Figure 1H:
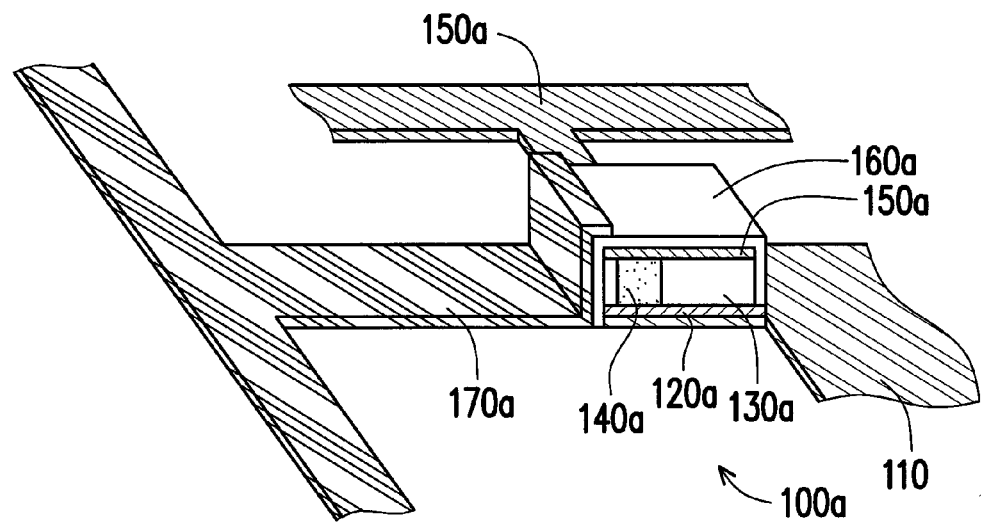
FIG. 1H is a schematic three-dimensional view of the semiconductor device depicted in FIG. 1G.

Finally, referring FIG. 1G, the first metal layer 120 exposed outside of the gate insulation layer 160a is removed by using the gate insulation layer 160a as an etching mask to expose a portion of the pixel electrode 110 and define a drain 120a. Herein, an orthographic projection area of the source 150a on the substrate 10 is overlapped with and smaller than an orthographic projection area of the drain 120a on the substrate 10. Next, a side-gate 170a is formed on the gate insulation layer 160a, in which the side-gate 170a extendedly covers the substrate 10 along at least one side 162 of the gate insulation layer 160a, and an extending direction of a portion of the side-gate 170a is identical to a vertical stacking direction of the drain 120a, the semiconductor channel layer 140a and the source 150a. In this case, the side-gate 170a extendedly covers the substrate 10 from the gate insulation layer 160a located above the source 150a along the side 162 of the gate insulation layer 160a. Of course, in order to obtain better device characteristics, a protective layer 180 may also be selectively formed to cover the side-gate 170a, the gate insulation layer 160a, the drain 130a and the portion of the pixel electrode 110 after forming the side-gate 170a on the gate insulation layer 160a. So far, the manufacturing of the semiconductor device 100a is substantially completed.

Structurally, referring to FIG. 1G and FIG. 1H, the semiconductor device 100a is adapted for being disposed on the substrate 10, in which the semiconductor device 100a includes the pixel electrode 110, the drain 120a, the sacrifice layer 130a, the semiconductor channel layer 140a, the source 150a, the gate insulation layer 160a and the side-gate 170a. The pixel electrode 110 is disposed on the substrate 10. The drain 120a is disposed on the pixel electrode 110 and exposes a portion of the pixel electrode 110; the sacrifice layer 130a and the semiconductor channel layer 140a are disposed on the drain 120a; and the source 150a is disposed on the semiconductor channel layer 140a and the sacrifice layer 130a. In other words, the drain 120a, the semiconductor channel layer 140a and the source 150a are sequentially stacked on the pixel electrode 110. The sacrifice layer 130a covers the semiconductor channel layer 140a, and the upper surface 131 of the sacrifice layer 130a is substantially coplanar with the upper surface 141 of the semiconductor channel layer 140a. In this case, the orthographic projection area of the source 150a on the substrate 10 is overlapped with and smaller than the orthographic projection area of the drain 120a on the substrate 10. The gate insulation layer 160a is disposed on the substrate 10 and covers the source 150a and the sacrifice layer 130a and surrounds the semiconductor channel layer 140a. The side-gate 170a is disposed on the gate insulation layer 160a and extendedly covers the substrate 10 along the side 162 of the gate insulation layer 160a, in which the extending direction of the portion of the side-gate 170a is identical to the vertical stacking direction of the drain 120a, the semiconductor channel layer 140a and the source 150a. Of course, in order to obtain better device characteristics, the semiconductor device 100a of the present embodiment may further include the protective layer 180, in which the protective layer 180 covers the side-gate 170a, the gate insulation layer 160a, the drain 120a and the portion of the pixel electrode 110.

According to the present embodiment, an opening 132 of the sacrifice material layer 130 is used as an alignment mark, so that methods such as sol-gel process, chemical vapor deposition (CVD) or physical vapor deposition (PVD) may be used for forming the semiconductor material layer 140a in the opening 132 of the sacrifice material layer 130. Compared with the conventional method of forming the semiconductor channel layer adopting the photolithography process which is restricted by lithography resolution, manufacturing of the semiconductor channel layer 140a according to the present embodiment may be adjust based on different demands without being restricted by lithography resolution in process. Moreover, according to the present embodiment, the drain 120a, the semiconductor channel layer 140a and the source 150a are sequentially and vertically stacked on the pixel electrode 110, such that a channel length L of the semiconductor 140a is equal to a thickness T of the semiconductor channel layer 140a. As a result, according to the present embodiment, the channel length L of the semiconductor channel layer 140a may be effectively reduced based on actual demands without being restricted by the lithography resolution in process, such that operational voltage required for the semiconductor device 100a of the present embodiment may also be substantially reduced.

Furthermore, when the semiconductor device 100a is turned on, channel regions may be formed between the source 150a and the drain 120a, and a driving current may flow from the source 150a to the drain 120a via the channel regions.

Conventionally, grain boundaries that are perpendicular to a direction of the driving current are present in the semiconductor channel layer 140a. These grain boundaries obstruct the driving current in the channel regions, and the degree of obstruction elevates as the number of grain boundaries increases. However, according to the present embodiment, a flowing direction of the driving current is identical to a vertical stacking direction of the source 150a, the semiconductor channel layer 140a and the drain 120a (i.e., said two direction are parallel to one another). Therefore, an electric current flowed into the semiconductor channel layer 140a is not affected by the grain boundaries, thereby increasing a carrier mobility of the semiconductor device 100a of the present embodiment.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2A:
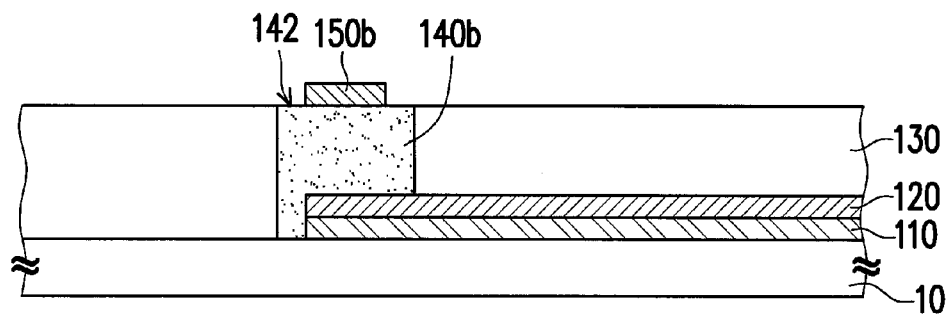
FIG. 2A to FIG. 2D are schematic cross-sectional views illustrating partial steps of a manufacturing method of a semiconductor device according to another embodiment of the invention.
Figure 2B:
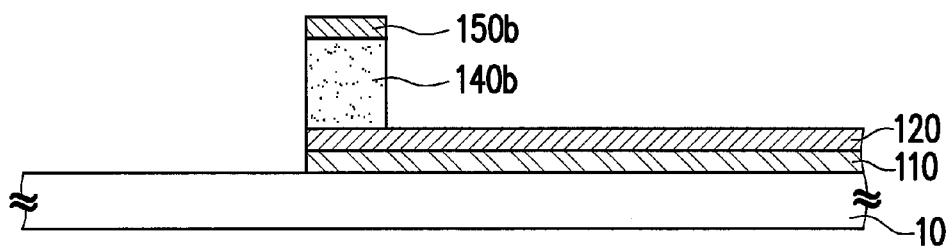
Figure 2C:
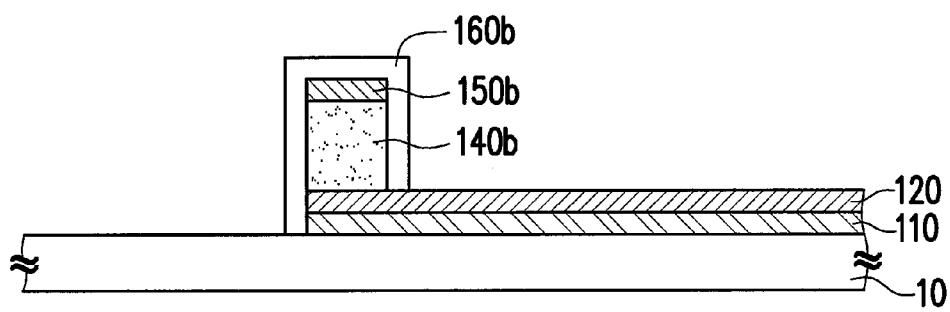
Figure 2D:
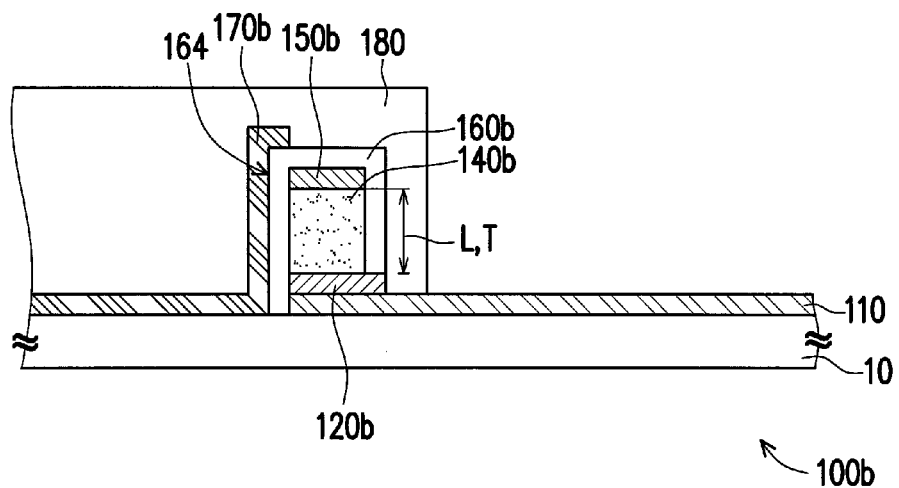

FIG. 2A to FIG. 2D are schematic cross-sectional views illustrating partial steps of a manufacturing method of a semiconductor device according to another embodiment of the invention. Referring to FIG. 2D and FIG. 1G together, a semiconductor device 100b in FIG. 2D is similar to the semiconductor device 100a in FIG. 1G, while the main difference therebetween lies in that the semiconductor device 100b is not provided with the sacrifice layer 130a as illustrated in the semiconductor device 100a in FIG. 1G. In other words, in the semiconductor device 100b of the present embodiment, a source 150b is only located on a semiconductor channel layer 140b, and a gate insulation layer 160b directly covers the source 150b and the semiconductor channel layer 140b. A side-gate 170b extendedly covers the substrate 10 from the gate insulation layer 160b located above the source 150b along a side 164 of the gate insulation layer 160b.

In the process, the semiconductor device 100b in the embodiment may be manufactured by a similar method to that of the semiconductor device 100a in the previous embodiment. Furthermore, referring to FIG. 2A, after removing the portion of the semiconductor material layer 140 located on the sacrifice material layer 130 as described in FIG. 1D, the source 150b is formed on an upper surface 142 of the semiconductor channel layer 140b. Herein, an orthographic projection area of the source 150a on the substrate 10 is overlapped with and smaller than an orthographic projection area of the semiconductor channel layer 140b on the substrate 10. In other words, the upper surface 142 of the semiconductor channel layer 140b is not completely covered by the source 150b.

Next, referring to FIG. 2B, the sacrifice material layer 130 and a portion of the semiconductor channel layer 140b exposed outside of the source 150b are removed by using the source 150b as an etching mask. In this case, a literal side of the semiconductor 140b is substantially coplanar with a literal side of the source 150b. Next, referring to FIG. 2C, the gate insulation layer 160b is formed on the substrate 10, in which the gate insulation layer 160b covers the source 150b and the semiconductor channel layer 140b and surrounds the semiconductor channel layer 140b. Finally, the first metal layer 120 exposed outside of the gate insulation layer 160b is removed by using the gate insulation layer 160b as an etching mask to expose a portion of the pixel electrode 110 and define a drain 120b. Herein, an orthographic projection area of the source 150b on the substrate 10 is overlapped with and smaller than an orthographic projection area of the drain 120b on the substrate 10. Next, a side-gate 170b is formed on the gate insulation layer 160b, in which the side-gate 170b extendedly covers the substrate 10 along at least one side 164 of the gate insulation layer 160b, and an extending direction of a portion of the side-gate 170b is identical to a vertical stacking direction of the drain 120b, the semiconductor channel layer 140b and the source 150b. Of course, in order to obtain better device characteristics, a protective layer 180 may also be selectively formed to cover the side-gate 170b, the gate insulation layer 160b, the drain 130b and the portion of the pixel electrode 110 after forming the side-gate 170b on the gate insulation layer 160b. So far, the manufacturing of the semiconductor device 100b is substantially completed.

According to the present embodiment, since the drain 120b, the semiconductor channel layer 140b and the source 150b are sequentially and vertically stacked on the pixel electrode 110, a channel length L of the semiconductor 140b is equal to a thickness T of the semiconductor channel layer 140b. As a result, according to the present embodiment, the channel length L of the semiconductor channel layer 140b may be effectively reduced based on actual demands without being restricted by the lithography resolution in process, such that operational voltage required for the semiconductor device 100b of the present embodiment may also be substantially reduced. In addition, according to the present embodiment, since a flowing direction of the driving current is identical to a vertical stacking direction of the source 150b, the semiconductor channel layer 140b and the drain 120b (i.e., said two directions are parallel to one another). Therefore, an electric current flowed into the semiconductor channel layer 140b is not affected by the grain boundaries, thereby increasing a carrier mobility of the semiconductor device 100b of the present embodiment.

Figure 2E:
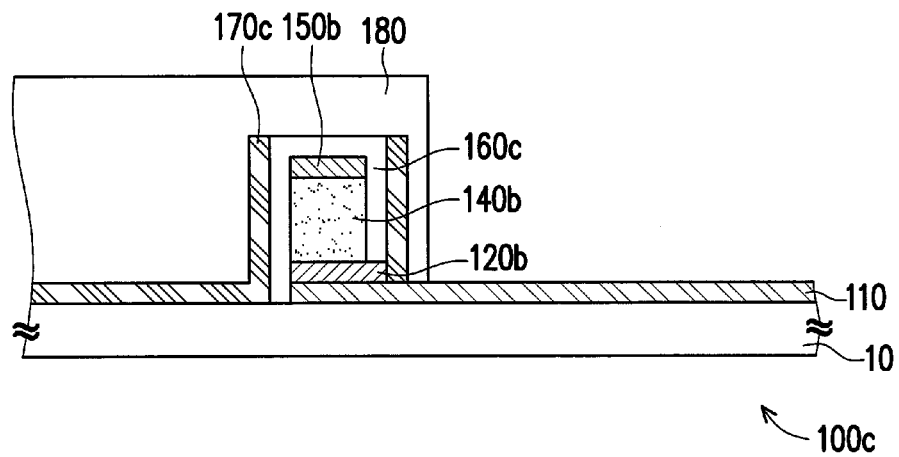
FIG. 2E is a schematic cross-sectional view of a semiconductor device according to an embodiment of the invention.

It should be noted that, the invention is not limited to positions for the side-gate 170b to be arranged, even though the side-gate 170b as embodied above extendedly covers the substrate 10 from the gate insulation layer 160b located above the source 150b along the side 164 of the gate insulation layer 160b. However, in other embodiments, referring to FIG. 2E, a side-gate 170c may also cover and surround the semiconductor channel layer 140b, which is still a part of the technical proposal of the present invention and does not depart from the protection scope of the invention.

Figure 3A:
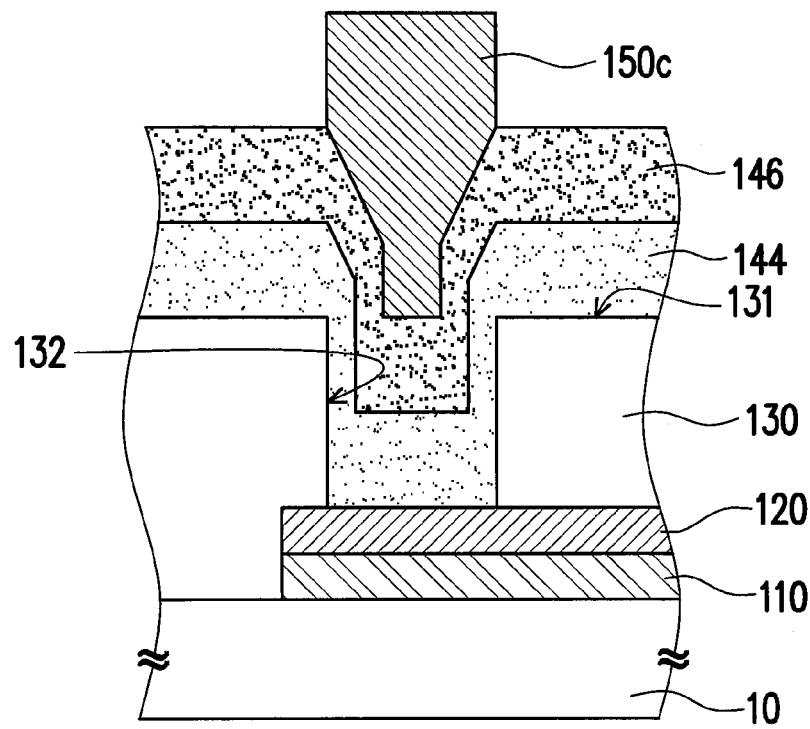
FIGS. 3A and 3B are schematic cross-sectional views illustrating forming semiconductor channel layers respectively according to two embodiments of the invention.

It should be noted that, the invention is not limited to structures of the semiconductor channel layers 140a and 140b, even though the semiconductor channel layers 140a and 140b as embodied above are a single layer structure. However, in other embodiments, referring to FIG. 3A, a first semiconductor material layer 144 and a second semiconductor material layer 146 stacked thereon may be formed by using chemical vapor deposition (CVD) or physical vapor deposition (PVD), in which the first semiconductor material layer 144 and the second semiconductor material layer 146 formed are conformally disposed with the upper surface 131 of the sacrifice layer 130 and the opening 132. That is, the opening 132 is not filled by the first semiconductor material layer 144 and the second semiconductor material layer 146, in stead, the first semiconductor material layer 144 and the second semiconductor material layer 146 are only deposited along the inner wall of the opening 132. Next, a source 150c is disposed in the opening 132, a semiconductor channel layer located on the drain may be formed by removing the first semiconductor material layer 144 and the second semiconductor material layer 146 exposed outside of the source 150c by using the source 150c as an etching mask. That is, the semiconductor channel layer of the present embodiment may be composed by the first semiconductor material layer 144 and the semiconductor material layer 146. Herein, the first semiconductor material layer 144 may be, for example, a n-type semiconductor material layer, where as the semiconductor material layer 146 may be, for example, a p-type semiconductor material layer.

Figure 3B:
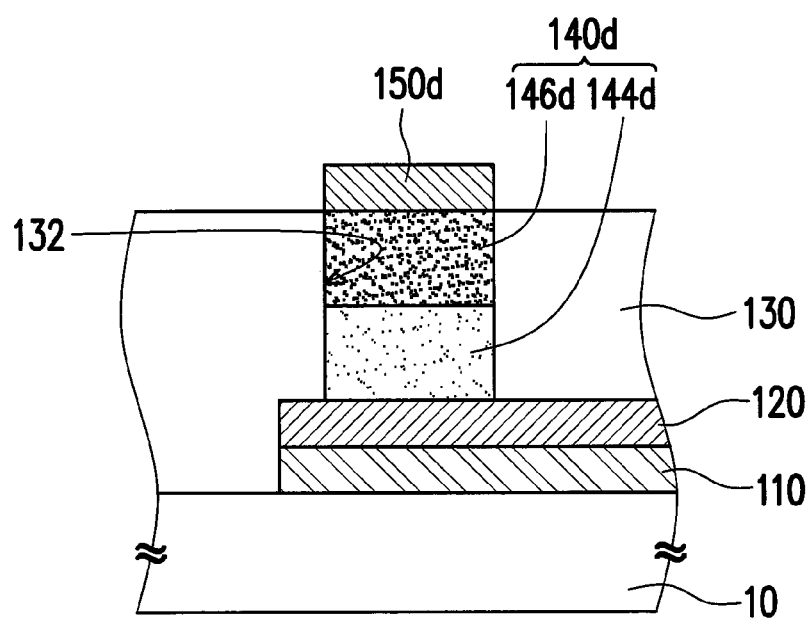

Alternatively, referring to FIG. 3B, a semiconductor channel layer 140d may be formed by using sol-gel process, in which said semiconductor channel layer 140d is composed by a first semiconductor channel layer 144d and a second semiconductor channel layer 146d stacked thereon, and a source 150d is disposed on the second semiconductor channel layer 144d and completely covers the second semiconductor channel layer 144d. Herein, the first semiconductor channel layer 144d may be, for example, a n-type semiconductor channel layer, where as the semiconductor channel layer 146d may be, for example, a p-type semiconductor channel layer. Said embodiment still belongs to a technical means adoptable in the present invention and falls within the protection scope of the present invention.

In view of above, according to the present embodiment, the drain, the semiconductor channel layer and the source are sequentially and vertically stacked on the substrate, such that a channel length of the semiconductor channel layer is equal to a thickness of the semiconductor channel layer. Compared with the conventional method of forming the semiconductor channel layer adopting the photolithography process which is restricted by lithography resolution, manufacturing method of the semiconductor channel layer according to the present embodiment may be effectively reduced the channel length without being restricted by the process. Furthermore, since the channel length of the semiconductor channel layer in the present embodiment is shorter than that of the semiconductor channel layer in the conventional technique, the operational voltage required for the semiconductor device according to the present embodiment of the invention may also be substantially reduced. In addition, according to the present embodiment of the invention, a flowing direction of the driving current is identical to a vertical stacking direction of the source, the semiconductor channel layer and the drain. Therefore, an electric current in the semiconductor channel layer is not affected by the grain boundaries, thereby increasing a carrier mobility of the semiconductor device of the present embodiment of the invention.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A semiconductor device adapted for being disposed on a substrate, comprising:
    a pixel electrode disposed on the substrate;
    a drain disposed on the pixel electrode and exposing a portion of the pixel electrode;
    a semiconductor channel layer disposed on the drain;
    a source disposed on the semiconductor channel layer;
    a gate insulation layer disposed on the substrate and at least covering the source and surrounding the semiconductor channel layer; and
    a side-gate disposed on the gate insulation layer and extendedly covering the substrate along at least one side of the gate insulation layer, wherein an extending direction of a portion of the side-gate is identical to a stacking direction of the drain, the semiconductor channel layer and the source.

2. The semiconductor device as recited in claim 1, further comprising:
    a sacrifice layer disposed on the drain, wherein the sacrifice layer covers on the semiconductor channel layer, and an upper surface of the sacrifice layer is coplanar with an upper surface of the semiconductor channel layer.

3. The semiconductor device as recited in claim 2, wherein the source is further extendedly disposed on the sacrifice layer.

4. The semiconductor device as recited in claim 1, wherein an orthographic projection area of the source on the substrate is overlapped with and smaller than an orthographic projection area of the drain on the substrate.

5. The semiconductor device as recited in claim 1, wherein the gate insulation layer covers the source and the semiconductor channel layer.

6. The semiconductor device as recited in claim 1, further comprising:
    a protective layer covering the side-gate, the gate insulation layer, the drain and the portion of the pixel electrode.

* * * * *